(12) United States Patent
Chang et al.

(10) Patent No.: US 10,796,954 B2
(45) Date of Patent: Oct. 6, 2020

(54) SEMICONDUCTOR STRUCTURE AND METHOD FOR FORMING THE SAME

(71) Applicant: TAIWAN SEMICONDUCTOR MANUFACTURING COMPANY LTD., Hsinchu (TW)

(72) Inventors: Gung-Pei Chang, Taipei (TW); Yao-Wen Chang, Taipei (TW); Hai-Dang Trinh, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/281,689

(22) Filed: Feb. 21, 2019

(65) Prior Publication Data

US 2020/0006130 A1     Jan. 2, 2020

Related U.S. Application Data

(60) Provisional application No. 62/691,418, filed on Jun. 28, 2018.

(51) Int. Cl.
*H01L 23/48* (2006.01)
*H01L 23/52* (2006.01)
(Continued)

(52) U.S. Cl.
CPC .... *H01L 21/76847* (2013.01); *H01L 21/0228* (2013.01); *H01L 21/02118* (2013.01);
(Continued)

(58) Field of Classification Search
CPC ......... H01L 21/76843; H01L 21/76846; H01L 23/53295; H01L 21/76849;
(Continued)

(56) References Cited

U.S. PATENT DOCUMENTS

2015/0348905 A1* 12/2015 Tsai ................. H01L 21/76898
257/774
2018/0269161 A1* 9/2018 Wu ....................... H01L 23/562

OTHER PUBLICATIONS

"Polyimide Boosts High-Temperature Performance." National Aeronautics and Space Administration (NASA) technology transfer program, Industrial Productivity (2008) "https://spinoff.nasa.gov/Spinoff2008/ip_5.html".

(Continued)

*Primary Examiner* — Theresa T Doan
(74) *Attorney, Agent, or Firm* — WPAT, P.C., Intellectual Property Attorneys; Anthony King

(57) ABSTRACT

A semiconductor structure includes a first substrate, a metallic pad disposed over the first substrate, a dielectric structure disposed over the first substrate and exposing a portion of the metallic pad, a bonding structure disposed over and electrically connected to the metallic pad, a barrier ring surrounding the bonding structure, and a through-hole penetrating the first substrate and the dielectric structure. The bonding structure includes a bottom and a sidewall, the bottom of the bonding structure is in contact with the metallic pad, a first portion of the sidewall of the bonding structure is in contact with the dielectric structure, and a second portion of the sidewall of the bonding structure is in contact with the barrier ring.

20 Claims, 15 Drawing Sheets

(51) Int. Cl.
  *H01L 29/40* (2006.01)
  *H01L 21/768* (2006.01)
  *H01L 21/285* (2006.01)
  *H01L 21/02* (2006.01)
  *H01L 21/311* (2006.01)
  *H01L 23/00* (2006.01)

(52) U.S. Cl.
  CPC .. *H01L 21/02178* (2013.01); *H01L 21/02274* (2013.01); *H01L 21/28556* (2013.01); *H01L 21/28568* (2013.01); *H01L 21/31116* (2013.01); *H01L 21/76802* (2013.01); *H01L 21/76831* (2013.01); *H01L 24/05* (2013.01); *H01L 24/13* (2013.01); *H01L 24/83* (2013.01); H01L 2224/0401 (2013.01); H01L 2224/13155 (2013.01); H01L 2224/13644 (2013.01); H01L 2224/8385 (2013.01); H01L 2224/83805 (2013.01)

(58) Field of Classification Search
  CPC ............. H01L 21/76831; H01L 23/481; H01L 23/528; H01L 21/76879; H01L 21/76877; H01L 21/76802; H01L 21/76834; H01L 21/76847; H01L 21/76885; H01L 21/7682; H01L 21/7685; H01L 23/49827; H01L 21/764
  USPC ........................................................ 257/751
  See application file for complete search history.

(56) References Cited

OTHER PUBLICATIONS

Turban, Guy, and Michel Rapeaux. "Dry Etching of Polyimide in O 2-CF 4 and O 2-SF 6 Plasmas." Journal of the Electrochemical Society 130.11 (1983): 2231-2236.

Kim, Jae-Whan, Yong-Chun Kim, and Won-Jong Lee. "Reactive ion etching mechanism of plasma enhanced chemically vapor deposited aluminum oxide film in CF4/O2 plasma." Journal of applied physics 78.3 (1995): 2045-2049.

* cited by examiner

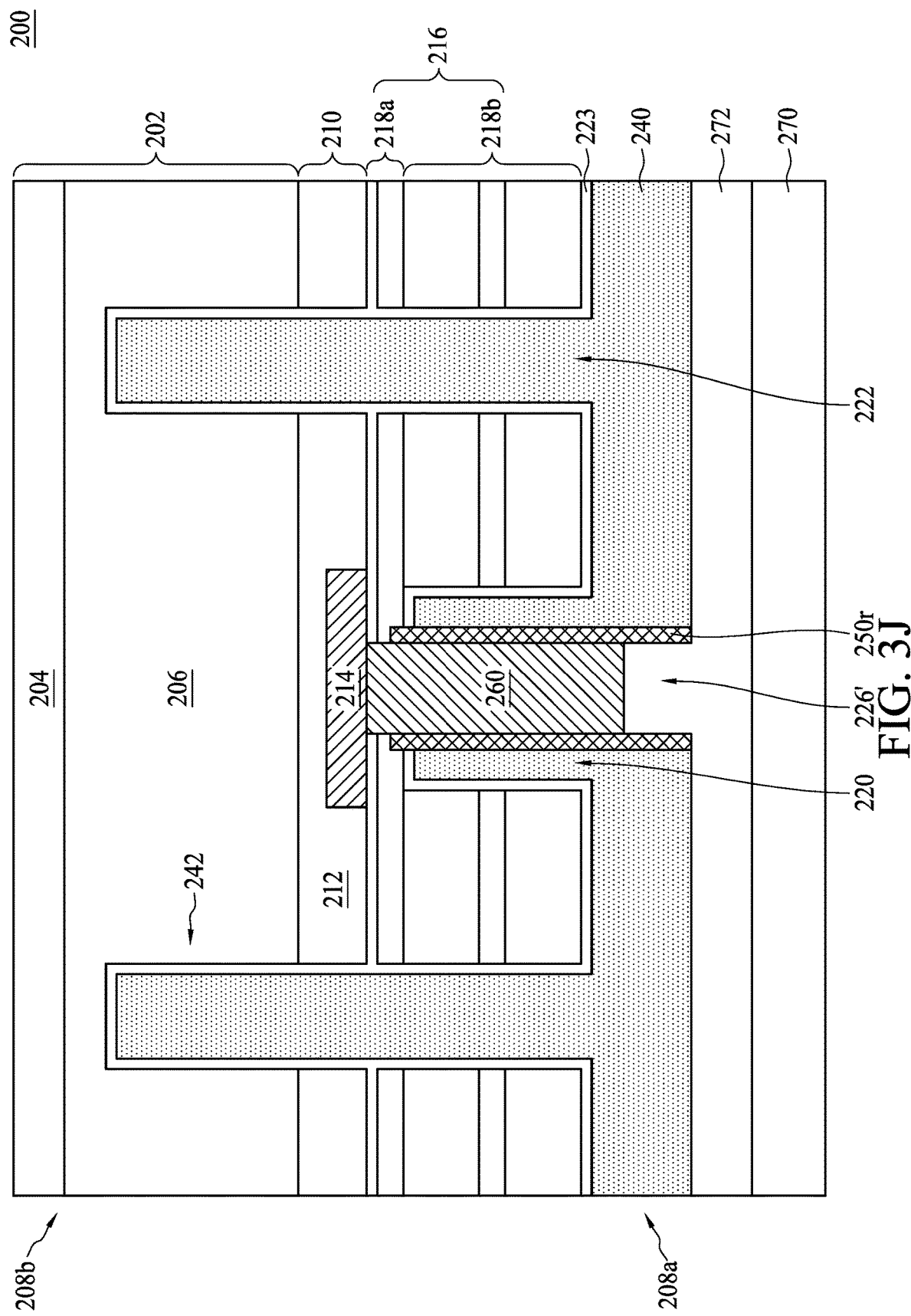

SEMICONDUCTOR STRUCTURE AND METHOD FOR FORMING THE SAME

PRIORITY DATA

This patent claims the benefit of U.S. Provisional Patent Application Ser. No. 62/691,418 filed Jun. 28, 2018, the entire disclosure of which is hereby incorporated by reference.

BACKGROUND

Dielectric materials are used in the semiconductor manufacturing field for many purposes. They can be used to electrically isolate one region from another region, to electrically isolate one device from another device, or to electrically isolate conductive lines of an interconnect structure from other conductive lines of the interconnect structure.

Further, the dielectric materials that are deposited on a substrate or a layer can be etched or partially removed for forming other elements. For example, when forming conductive lines of an interconnect structure, the dielectric materials are etched and thus trenches and via holes are formed within. Conductive materials are then formed to fill the trenches and via holes, and thus the interconnect structure including conductive lines and conductive vias is obtained. In addition to, or instead of, removing the dielectric materials for forming the other elements, the dielectric material is sometimes removed to release elements or devices in different applications. For example, in CMOS MEMS systems, there are various operations for releasing the MEMS devices. One such operation involves removing the dielectric materials that are used to support and fix the MEMS device, prior to releasing the MEMS device itself.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A to 3L are schematic drawings illustrating a semiconductor structure at various fabrication stages constructed according to aspects of the present disclosure in one or more embodiments.

DETAILED DESCRIPTION

Figure 1:
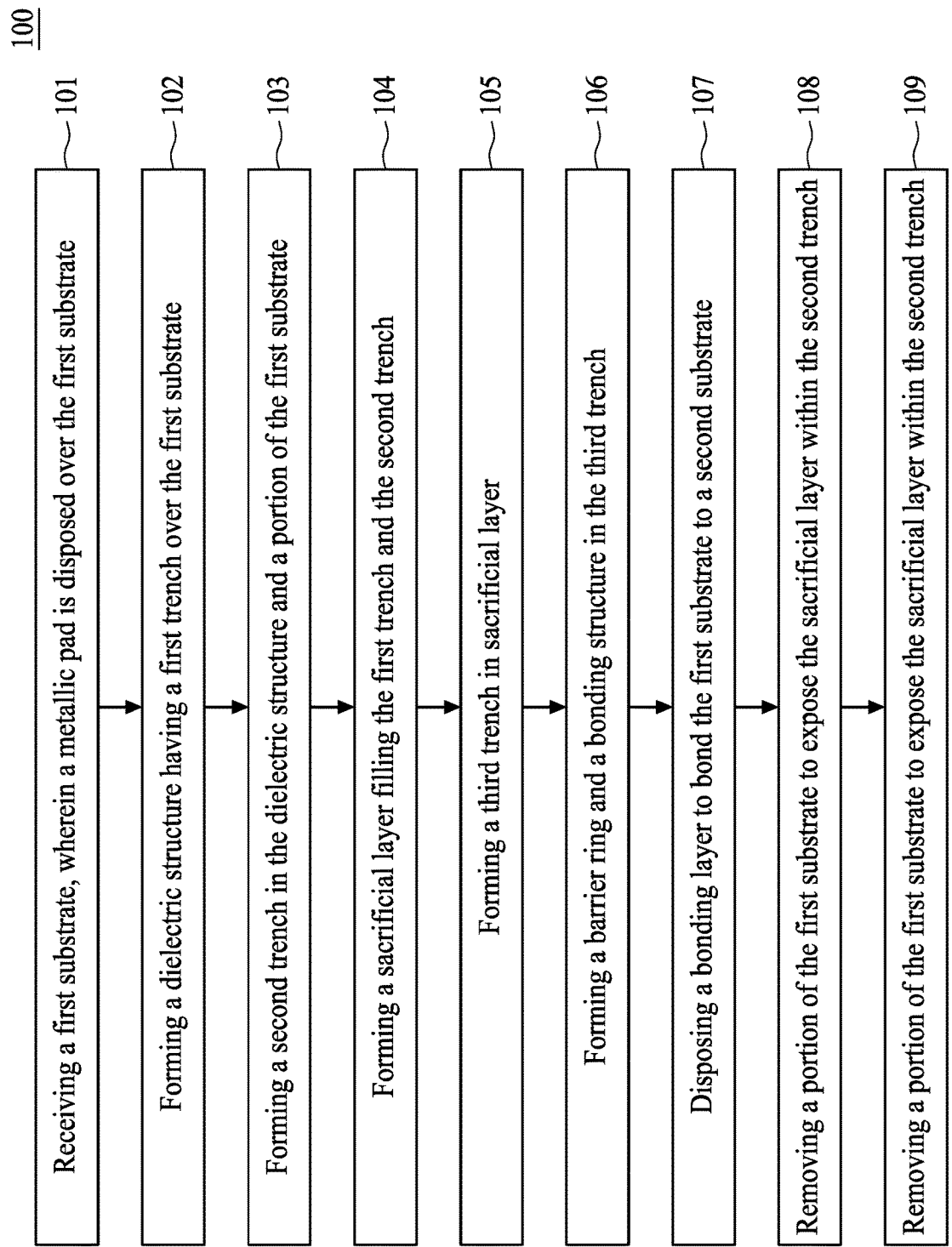
FIG. 1 is a flowchart representing a method for manufacturing a semiconductor structure according to aspects of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first," "second" and "third" describe various elements, components, regions, layers and/or sections, and these elements, components, regions, layers and/or sections should not be limited by these terms. These terms may be only used to distinguish one element, component, region, layer or section from another. The terms such as "first", "second" and "third" when used herein do not imply a sequence or order unless clearly indicated by the context.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Vapor phase hydrofluoric acid (vHF) etching is used to etch a sacrificial material such as silicon oxide, and thus to release devices, such as a MEMS device during fabrication of a CMOS MEMS system. The released device can therefore move or flex to achieve its desired functionality. In some embodiments, the vHF, which is extremely corrosive, may come into contact with a surface of another element. As a result, during fabrication of some typical CMOS devices, undesired etching can occur and the vHF can cause accidental damage to inter-metal dielectrics of the CMOS circuit. This undesired etching reduces reliability and performance of the entire system. Therefore, a reliable barrier layer is required.

The present disclosure provides a semiconductor structure including a barrier ring that is able to withstand exposure to vHF. The barrier ring is disposed over a sidewall of a conductive structure and helps to protect dielectric materials around the conductive structure. Accordingly, the problem of undesired etching of the dielectric materials is mitigated.

It should be easily understood that the semiconductor structure including the barrier ring provided in accordance with some embodiments of the present disclosure can be adopted to a device that requires a device-releasing operation during fabrication, such as a MEMS device or other IC devices.

Figure 3A:
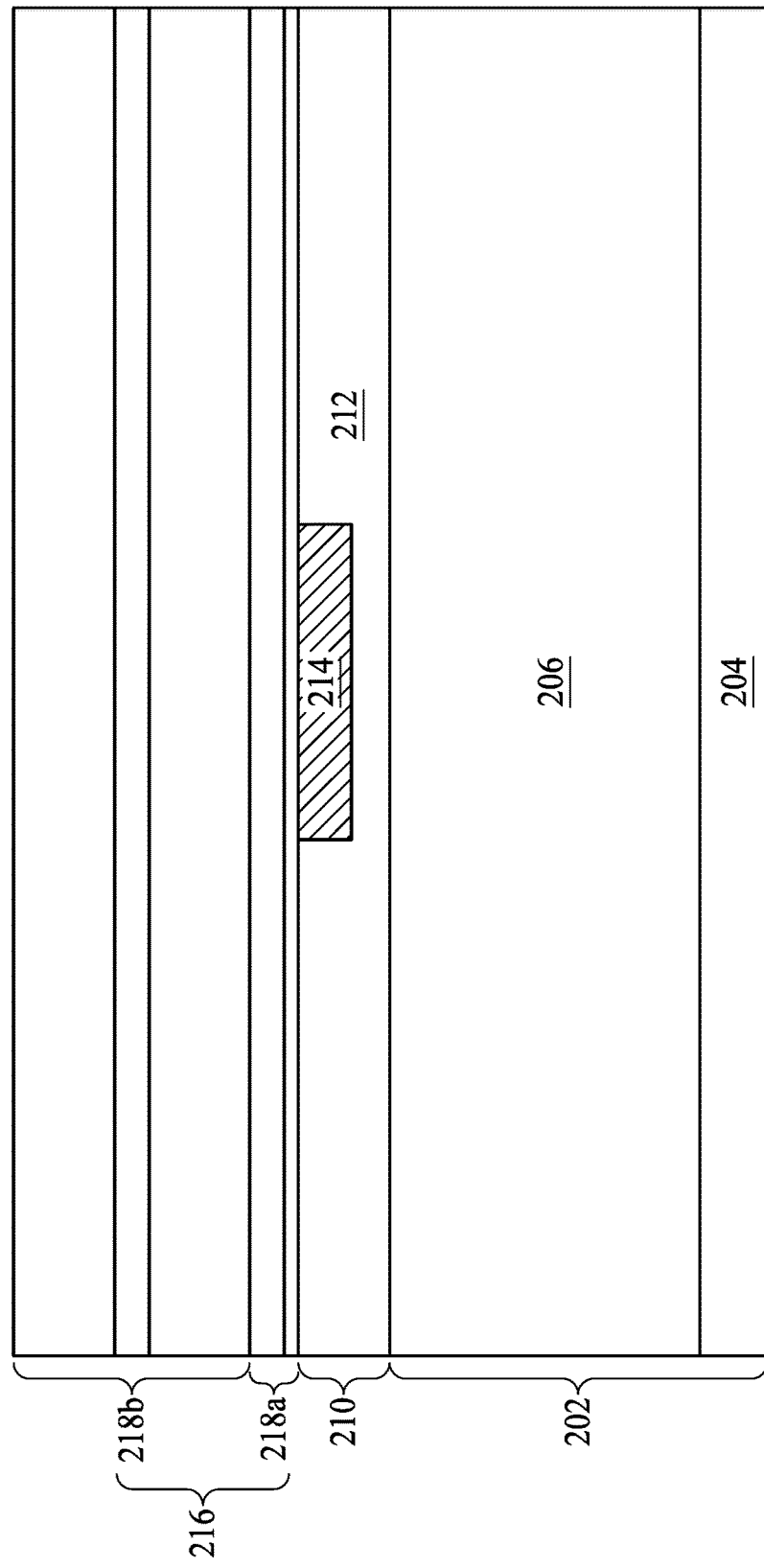
Figure 3B:
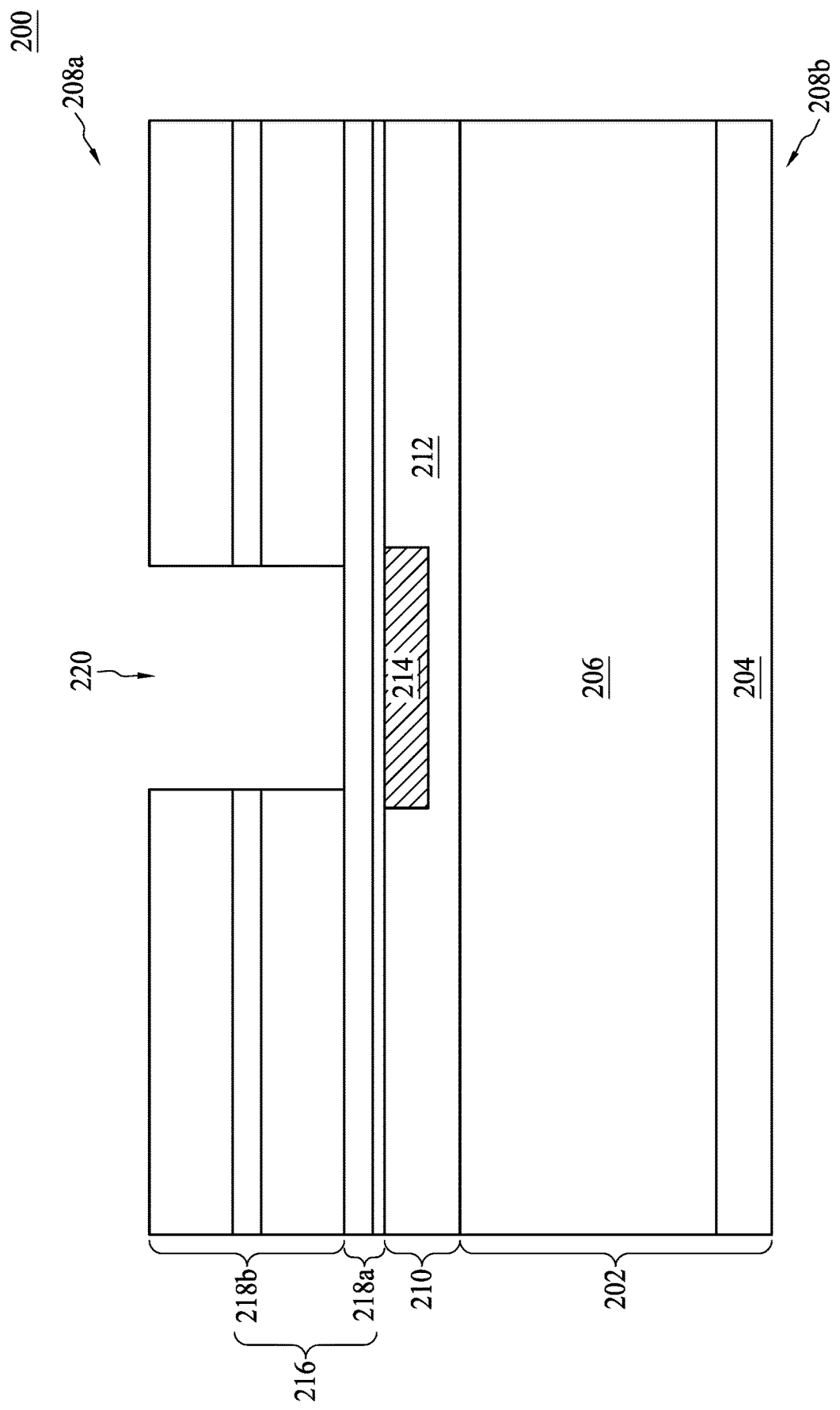
Figure 3C:
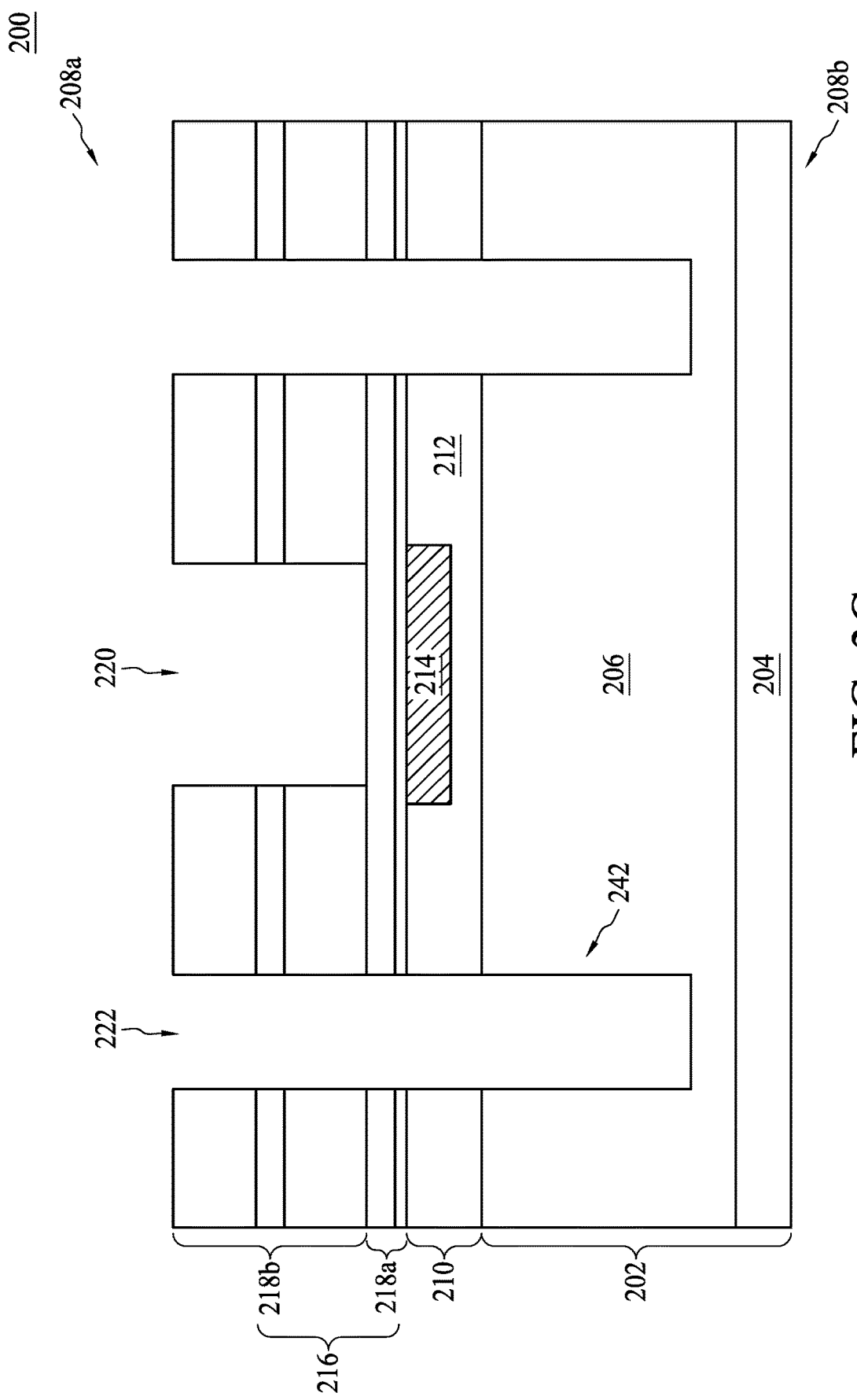
Figure 3D:
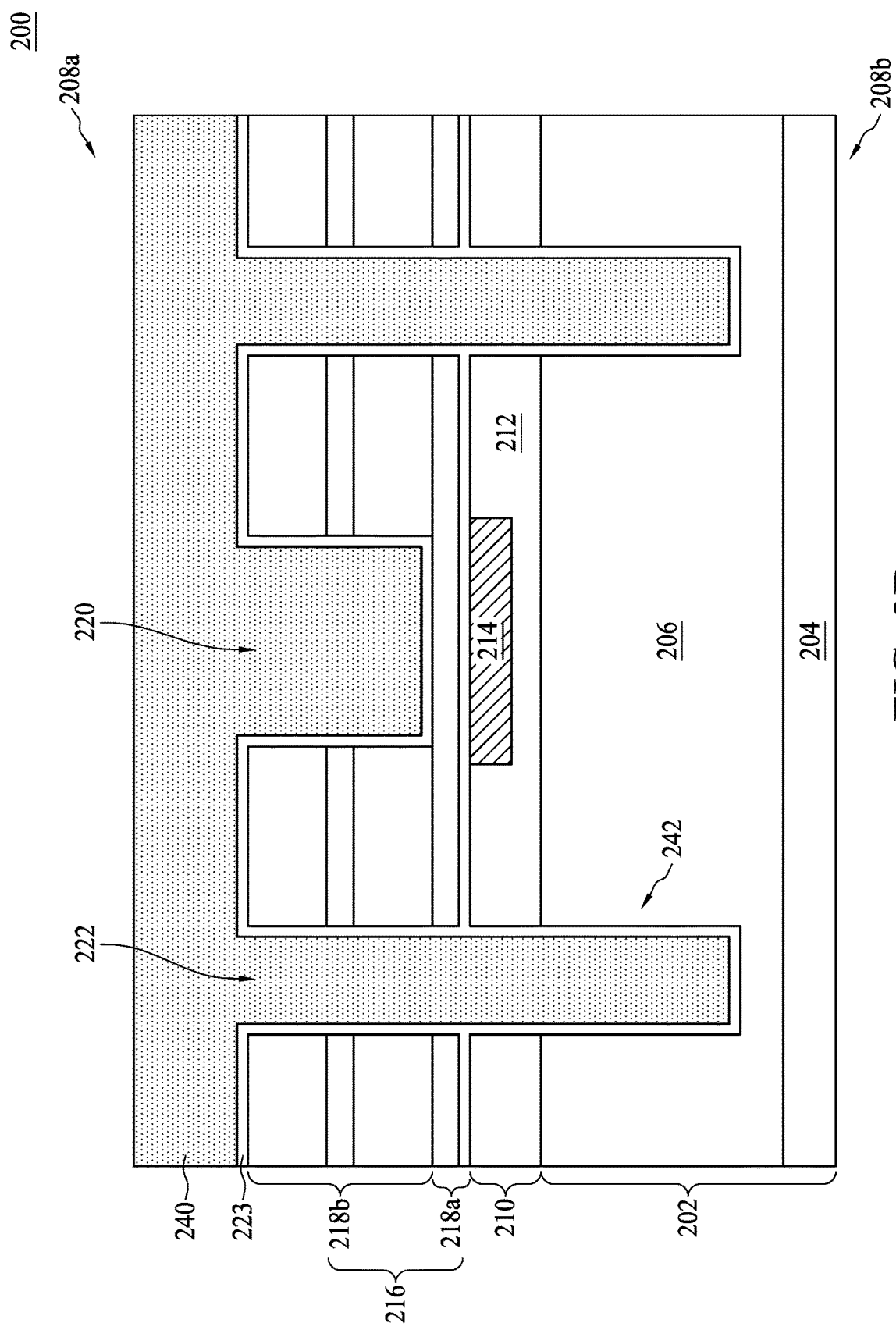

FIG. 1 is a flowchart of a method 100 for forming a semiconductor structure. The method 100 includes an operation 101, receiving a first substrate 202, as shown in FIG. 3A. The first substrate includes a first side 208a and a second side 208b opposite to the first side 208a. Further, a metallic pad 214 is disposed over the first side 208a. The method 100 further includes an operation 102, forming a dielectric structure 216 over the first substrate, as shown in FIG. 3B. The dielectric structure 216 is disposed on the first side 208a of the first substrate 202. Further, the dielectric structure 206 includes a first trench 220 directly above the metallic pad 214. The method 100 further includes an operation 103, forming a second trench 222 in the dielectric structure 216 and a portion of the first substrate 202, as shown in FIG. 3C. The second trench 222 penetrates the entire dielectric structure 216 and a portion of the first substrate 202. Further, the second trench 222 is offset from the metallic pad 214 and the first trench 220. The method 100 further includes an operation 104, forming a sacrificial layer 240 filling the first trench 220 and the second trench 222 over the first substrate 202, as shown in FIG. 3D. The method 100 further includes an operation 105, forming a third trench 226' in the sacrificial layer 240, as shown in FIG. 3H. In some embodiments, the metallic pad 214 is exposed through the third trench 226'. The method 100 further includes an operation 106, forming a barrier ring 250r and a bonding structure 260 in the third trench 226', as shown in FIGS. 3H and 3I. The method 100 further includes an operation 107, disposing a bonding layer to bond the first substrate 202 to a second substrate 270, as shown in FIG. 3J. Further, the first substrate 202 is bonded to the second substrate 270 on the first side 208a of the first substrate 202. The method 100 further includes an operation 108, removing a portion of the first substrate 202 to expose the sacrificial layer 240 within the second trench, as shown in FIG. 3K. The method 100 further includes an operation 109, removing the sacrificial layer, as shown in FIG. 3L. The method 100 will be further described according to one or more embodiments. It should be noted that the operations of the method 100 may be rearranged or otherwise modified within the scope of the various aspects. It should be further be noted that additional operations may be provided before, during, and after the method 100, and that some other operations may be only briefly described herein. Thus, other implementations are possible within the scope of the various aspects described herein.

Figure 2:
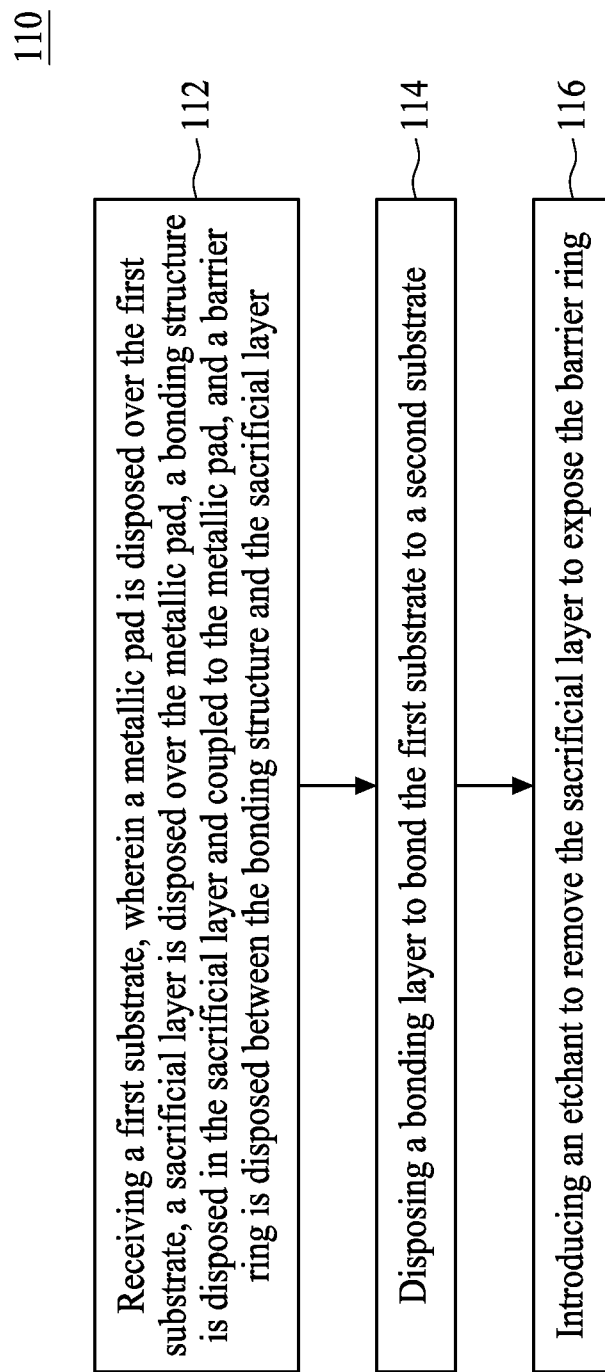
FIG. 2 is a flowchart representing a method for manufacturing a semiconductor structure according to aspects of the present disclosure.

FIG. 2 is a flowchart of a method 110 for forming a semiconductor structure. The method 110 includes an operation 112, receiving a first substrate 202, as shown in FIG. 3I. In some embodiments, a metallic pad 214 is disposed over the first substrate 202, a sacrificial layer 240 is disposed over the metallic pad 214, a bonding structure 260 is disposed in the sacrificial layer and coupled to the metallic pad 214, and a barrier ring 250r is disposed between the bonding structure 260 and the sacrificial layer 240. The method 110 further includes an operation 114, disposing a bonding layer 272 to bond the first substrate 202 to a second substrate 270, as shown in FIG. 3J. The method 110 further includes an operation 116, introducing an etchant to remove the sacrificial layer 240 to expose the barrier ring as shown in FIG. 3L. Further, an etching rate of the etchant to the barrier ring is less than approximately 1 nm/min. The method 110 will be further described according to one or more embodiments. It should be noted that the operations of the method 110 may be rearranged or otherwise modified within the scope of the various aspects. It should be further be noted that additional operations may be provided before, during, and after the method 110, and that some other operations may be only briefly described herein. Thus, other implementations are possible within the scope of the various aspects described herein.

FIGS. 3A to 3L are schematic drawings illustrating a semiconductor structure 200 at various fabrication stages constructed according to aspects of the present disclosure in one or more embodiments. According to operation 101, a substrate 202 is received or provided. The substrate 202 can include a base layer 204 and an active layer 206. In some embodiments, the base layer 204 can be a semiconductor layer such as a polysilicon layer, and the active layer 206 can be an epitaxial semiconductor layer, but the disclosure is not limited thereto. In some embodiments, the active layer 206 includes a plurality of devices (not shown) formed therein. The devices can be, for example but not limited to, metal-oxide-semiconductor field effect transistors (MOSFETs), finFETs, bipolar junction transistors (BJTs), junction field-effect transistors (JFETs), diodes, or photonic devices. Further, the substrate 202 can include a first side 208a and a second side 208b. An interconnect structure 210 can be disposed over the active layer 206 of the substrate 202 on the first side 208a. The interconnect structure 210 can include a plurality of BEOL metallization layers (not shown) stacked in an inter-metal dielectric (IMD) layer 212. One or more contacts of the interconnect structure 210 are electrically connected to the device disposed over the active layer 206. In some embodiments, the IMD layer 212 can include a low-k dielectric material (i.e., a dielectric material with a dielectric constant less than 3.9) or an oxide, but the disclosure is not limited thereto. In some embodiments, a metallization layer 214 of the interconnect structure 210, for example but not limited to a fourth metallization layer (sometimes referred to M4) or a top metallization layer, can be exposed through the IMD layer 212 for forming other connections. In some embodiments, a metallic pad 214 can be disposed over the interconnect structure 210 for forming external connections.

Still referring to FIG. 3A, a dielectric structure 216 is disposed on the metallic pad 214 and the interconnect structure 210 at the first side 208a of the substrate 202 according to operation 102. In some embodiments, the dielectric structure 216 can be a multi-layer structure including a protection stack 218a and a passivation stack 218bs. Further, the protection stack 218a is disposed between the interconnect structure 210 and the passivation stack 218b, as shown in FIG. 3A. In some embodiments, the protection stack 218a of the dielectric structure 216 can include a single insulating layer. In some embodiments, the protection stack 218a can include at least two insulating layers, and the two insulating layers can be layers having different etching rates related to one etchant. For example but not limited thereto, the protection stack 218a can include a silicon carbide (SiC) layer and a SiN layer. In some embodiments, the SiC layer is sandwiched between the SiN layer and the interconnect structure 210, but the disclosure is not limited thereto. In some embodiments, a thickness of the SiN layer is greater than a thickness of the SiC layer, but the disclosure is not limited thereto. The passivation stack 218b of the dielectric structure 216 is formed over the protection stack 218a, and the passivation stack 218b can include a plurality of insulating layers. For example, the passivation stack 218b can include two silicon oxide (SiO) layers such as undoped silicon glass (USG) layers and a SiN layer sandwiched therebetween, but the disclosure is not limited thereto. In some embodiments, a thickness of the USG layers is greater than a thickness of the SiN layer. In some embodiments, the passivation stack 218b of the dielectric structure 216 is thick enough to provide a flat and even surface.

Referring to FIG. 3B, the dielectric structure 216 includes a first trench 220 according to operation 102. The first trench 220 is formed over the substrate 202 on the first side 208a. Further, the first trench 220 is formed directly above the metallic pad 214. In some embodiments, the first trench 220 penetrates the passivation stack 218b of the dielectric structure 216. Thus, the passivation stack 218b is exposed through a sidewall of the first trench 220, and the protection stack 218a is exposed through a bottom of the first trench 220. In some embodiments, a width of the first trench 220 is equal to or less than a width of the metallic pad 214, as shown in FIG. 3B.

Referring to FIG. 3C, a second trench 222 is formed in the dielectric structure 216 and a portion of the substrate 202 according to operation 103. In some embodiments, the second trench 222 can be formed by forming a patterned mask (not shown) such as a patterned photoresist over the substrate 202 on the first side 208a. The patterned mask can include openings defining location and dimension of the second trench 222. Further, the first trench 220 is filled with the patterned photoresist. The second trench 222 is then formed by etching the dielectric structure 216 (including the protection stack 218a and the passivation stack 218b), the interconnect structure 210, and a portion of the substrate 202 with the patterned mask serving as an etching mask. Next, the patterned mask is removed, and thus the second trench 222, which penetrates the entire dielectric structure 218, the entire interconnect structure 210, and the portion of the substrate 202, is obtained. In some embodiments, the second trench 222 penetrates a portion of the active layer 206 of the substrate 202, while the base layer 204 of the substrate 202 is impervious to the forming of the second trench 222, but the disclosure is not limited thereto. Further, the second trench 222 is offset from the metallic pad 214 and the first trench 220, as shown in FIG. 3C. Accordingly, the dielectric structure 216, the interconnect structure 210 and a portion of the active layer 206 are exposed through a sidewall of the second trench 222, and the active layer 206 is exposed through a bottom of the second trench 222. In some embodiments, a width of the second trench 222 is less than a width of the first trench 220, but the disclosure is not limited thereto.

Referring to FIG. 3D, a sacrificial layer 240 is formed to fill the first trench 220 and the second trench 222 according to operation 104. In some embodiments, an insulating layer 223 can be formed before the forming of the sacrificial layer 240. The insulating layer 223 can include Al-based material, such as aluminum oxide ($Al_2O_3$), but the disclosure is not limited thereto. Further, the insulating layer 223 is conformally formed to line bottoms and sidewalls of the first trench 220 and the second trench 222, as shown in FIG. 3D. In some embodiments, the dielectric structure 216 is sealed by the insulating layer 223. The sacrificial layer 240 is then formed on the insulating layer 223. In some embodiments, the sacrificial layer 240 can include SiO, such as a SiO layer formed by high density plasma (HDP) deposition and high aspect ratio process (HARP), but the disclosure is not limited thereto. In some embodiments, the sacrificial layer 240 is thick enough to provide a substantially flat surface over the substrate 202 on the first side 208a. In some embodiments, a planarization operation can be performed to planarize a surface of the sacrificial layer 240 and thus uniformity of the surface is further improved. In some embodiments, the sacrificial layer 240 can be a single layer. In other embodiments, the sacrificial layer 240 can be a multi-layer structure including at least two layers. For example, a SiO layer is formed to fill the first and second trenches 220 and 222, a planarization operation is performed to improve uniformity of a surface of the SiO layer, and a USG layer (not shown) is formed over the surface. Additionally, a sacrificial pillar 242 that penetrates a portion of the substrate 202 can be formed. Further, the sacrificial pillar 242 is offset from the metallic pad 214 and coupled to the sacrificial layer 240, as shown in FIG. 3D.

Figure 3E:
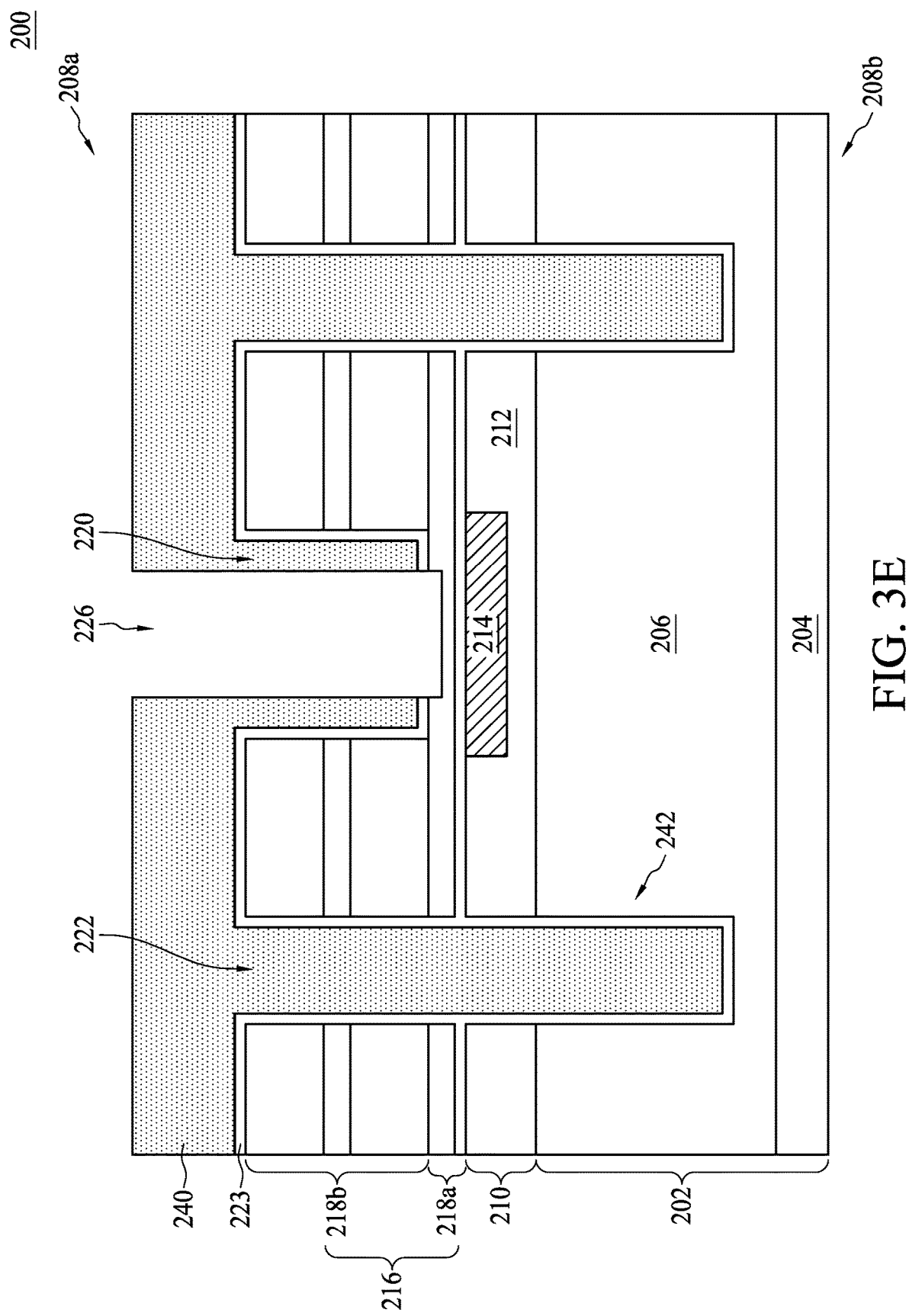

Referring to FIG. 3E, a third trench 226 is formed in the sacrificial layer 240 according to operation 105. In some embodiments, the third trench 226 is formed directly above the metallic pad 214. As shown in FIG. 3E, the third trench 226 is formed in the sacrificial layer 240 within the first trench 220. Further, a width of the third trench 226 is less than the width of the first trench 220. Consequently, the sacrificial layer 240 in the first trench 220 and the insulating layer 223 are exposed through sidewall of the third trench 226. Further, a portion of the dielectric structure 216, such as the protection stack 218a, is exposed through a bottom of the third trench 226, as shown in FIG. 3E. Notably, the protection stack 218a of the dielectric structure 216 provides protection for the metallic pad 214 during forming of the third trench 226.

Figure 3F:
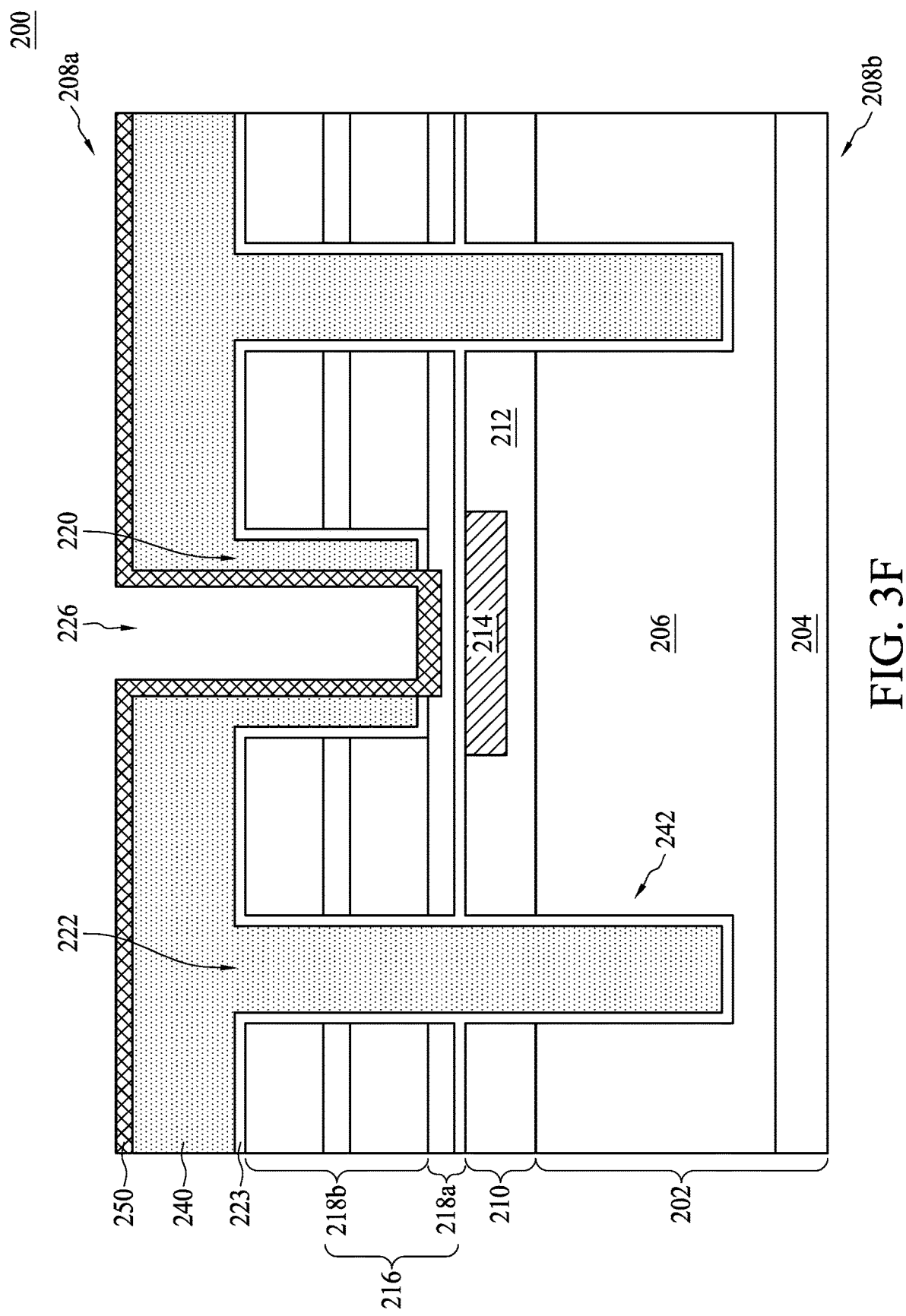

Referring to FIG. 3F, a barrier layer 250 is then formed over the substrate 202 on the first side 208a. The barrier layer 250 can be conformally formed to cover a top surface of the sacrificial layer 240, the sidewall of the third trench 226, and the bottom of the third trench 226, as shown in FIG. 3F. Further, the barrier layer 250 covers the protection stack 218a previously exposed through the bottom of the third trench 226.

In some embodiments, the barrier layer 250 is a conductive barrier layer including titanium nitride (TiN) formed by chemical vapor deposition (CVD). It has been found that the CVD-formed TiN layer provides good step coverage. Further, it has been found that the CVD-formed TiN layer has fewer of the column structures that are often found in physical vapor deposition (PVD) formed TiN layers.

In some embodiments, the barrier layer 250 is a conductive barrier layer including carbon-doped TiN. In some embodiments, the carbon-doped TiN layer can be formed by plasma enhanced chemical vapor deposition (PECVD). In some embodiments, tetrakis (dimethylamino) titanium (TDMAT) and nitrogen trihydride (ammonia)($NH_3$) are reacted to form the $TiN(C_X)$ layer during the PECVD. It has been found that the C-doped TiN layer provides good step coverage and fewer column structures.

In some embodiments, the barrier layer 250 is an insulative barrier layer including aromatic polyimide (PI). In some embodiments, the PI layer can be formed by CVD or atomic layer deposition (ALD). In some embodiments, pyromellitic dianhydride (PMDA) and diamines 4,4'-oxydianiline (ODA) are reacted to form the PI layer. It has been found that the PI layer provides good step coverage and higher thermal stability.

In some embodiments, the barrier layer 250 is an insulative barrier including $AlO_X$ formed by CVD. In some embodiments, trimethylaluminum (TMA) and aluminum chloride ($AlCl_3$) are reacted in CVD to form the $AlO_X$ layer, but the disclosure is not limited thereto.

Figure 3G:
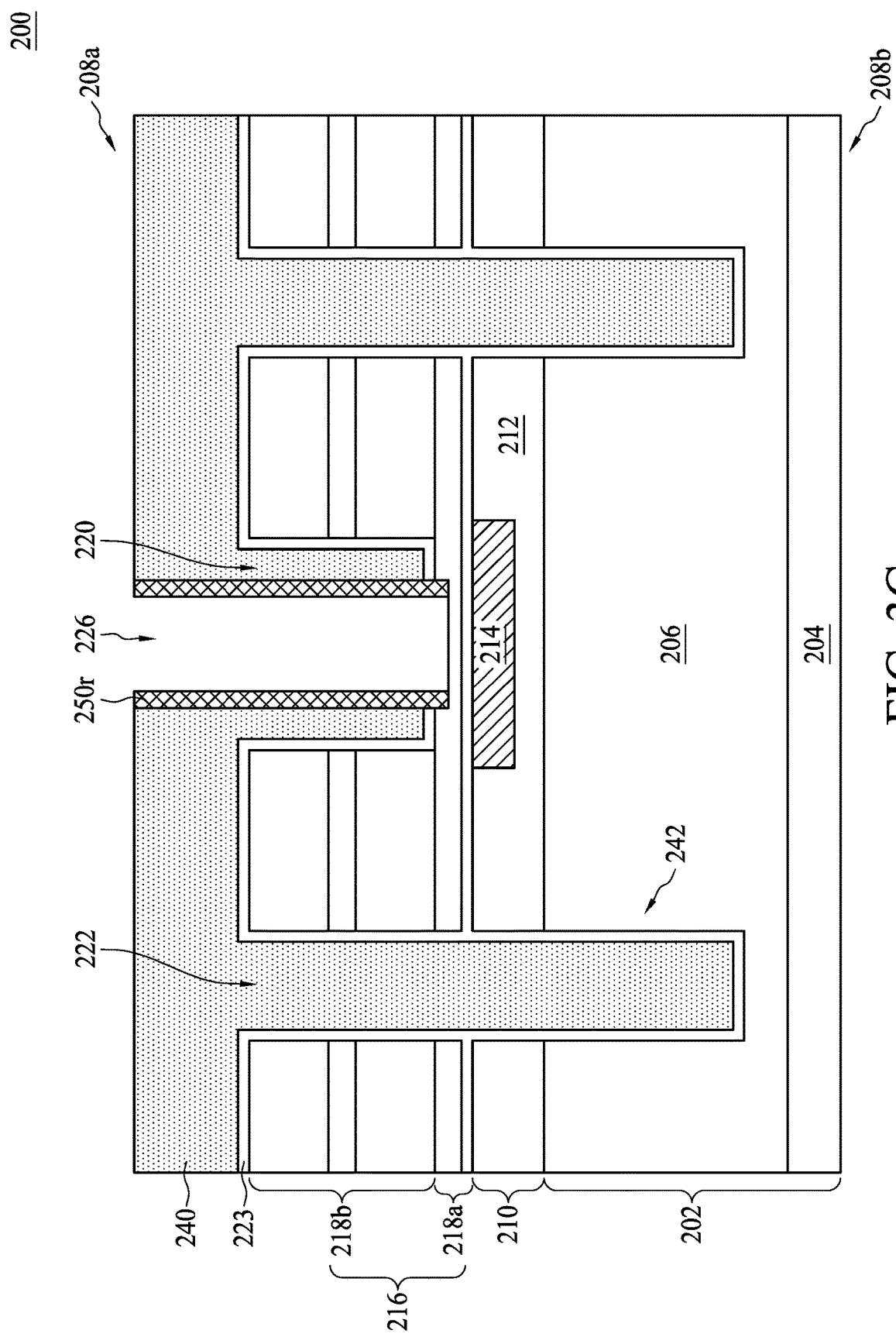
Figure 3H:
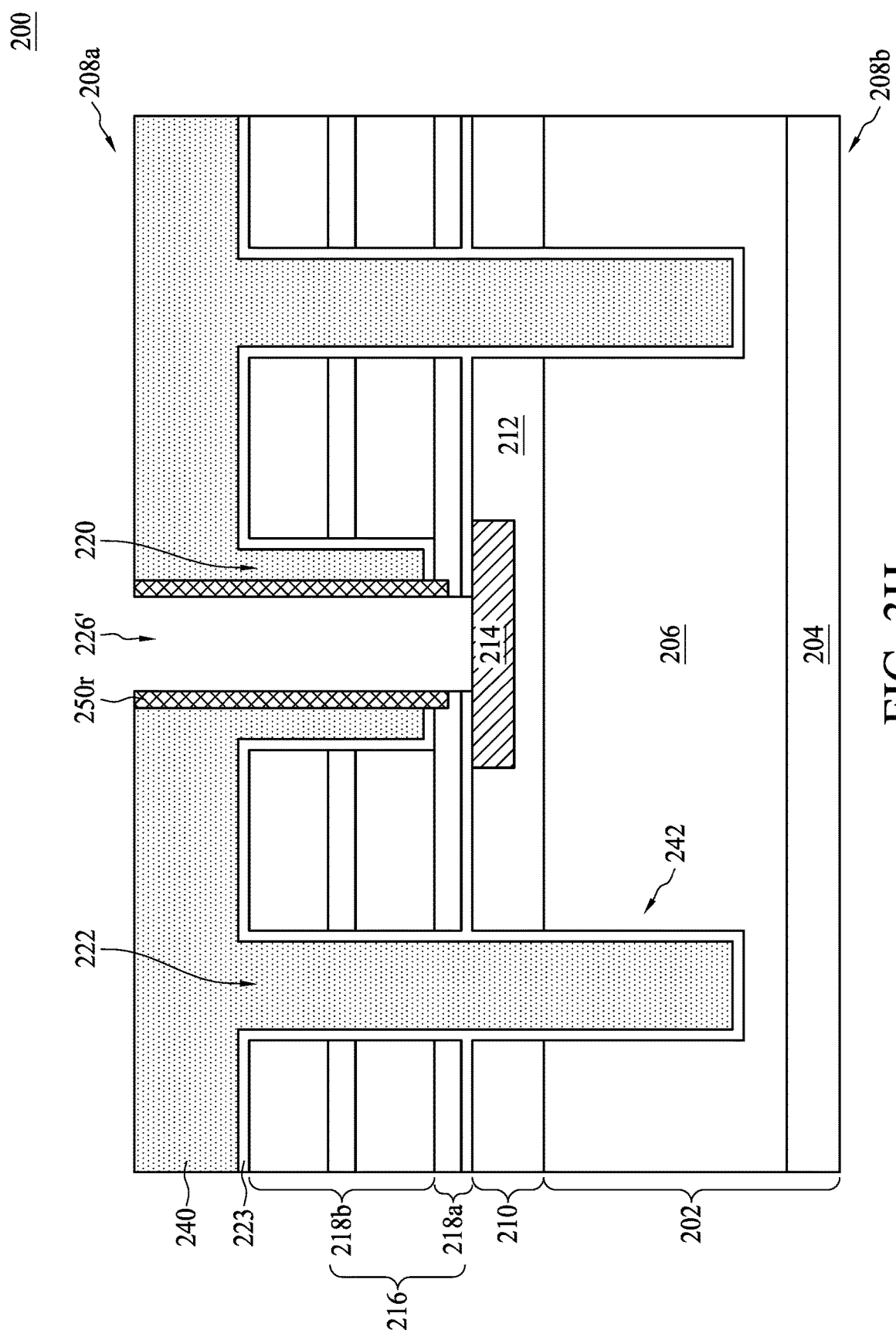
Figure 3I:
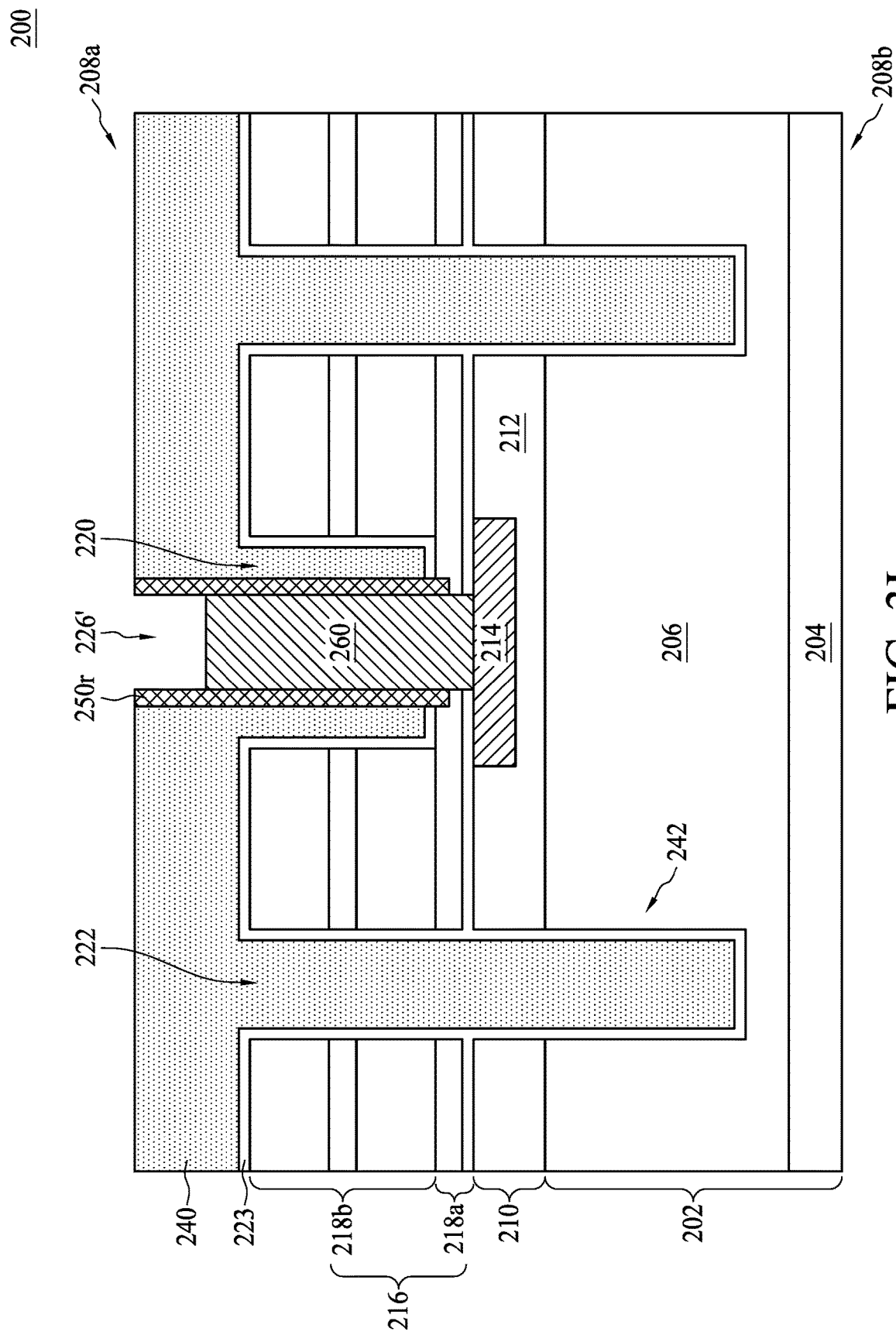
Figure 3K:
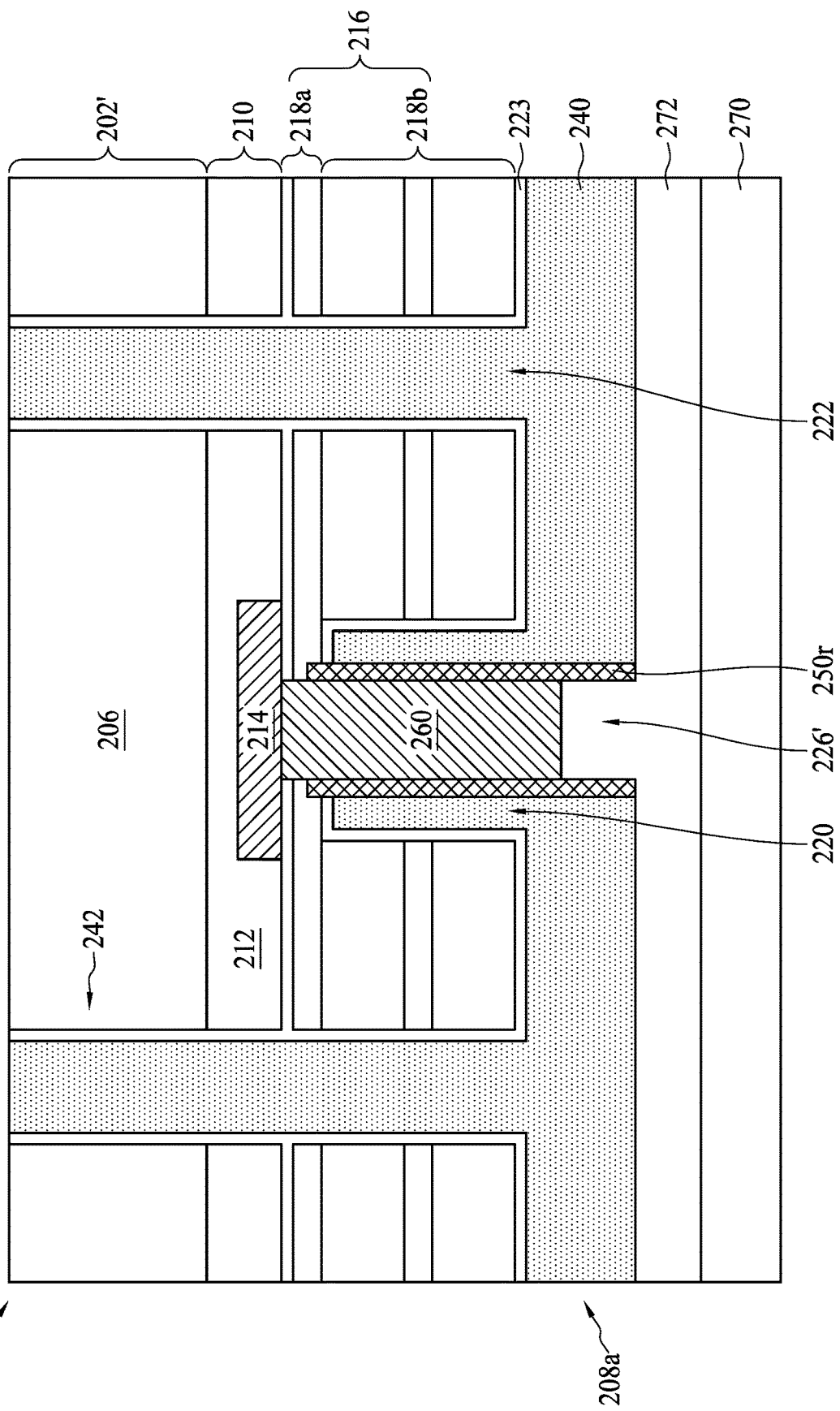
Figure 3L:
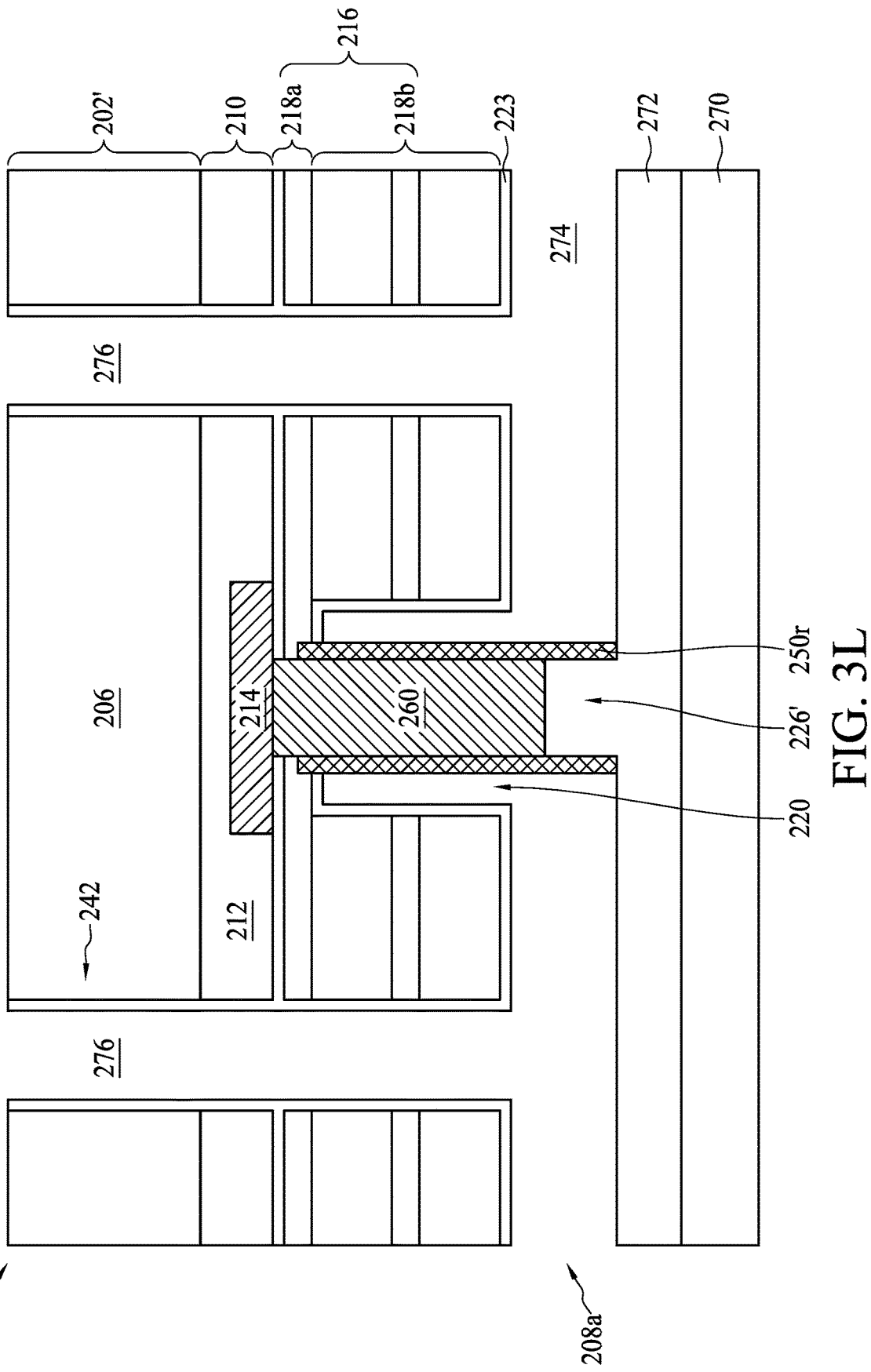

Referring to FIG. 3G, portions of the barrier layer 250 are then removed by, for example but not limited to, an etching back operation. In some embodiments, the portions of the barrier layer 250 are removed from the top surface of the sacrificial layer 240 and from the bottom of the third trench 226. As a result, the top surface of the sacrificial layer 240 is exposed, and a portion of the dielectric structure 216, such as the protection stack 218a, is again exposed through the bottom of the third trench 226. Additionally, the protection stack 218a still provides protection for the metallic pad 214 during the removal of the portion of the barrier layer 250. Accordingly, a barrier ring 250r covering the sidewall of the third trench 226 is formed according to operation 106.

Referring to FIG. 3H, the portion of the dielectric structure 216 (i.e., the protection stack 218a) exposed through the bottom of the third trench 226 is then removed. Accordingly, a depth of the third trench 226 is increased, and a deepened third trench 226' is obtained. Notably, by removing the protection stack 218a from the bottom of the third trench 226, the metallic pad 214 is exposed through a bottom of the third trench 226'. Further, the barrier ring 250r is exposed through a portion of a sidewall of the third trench 226' while the protection stack 218a of the dielectric structure 216 is exposed through another portion of the sidewall of the third trench 226', as shown in FIG. 3H.

Referring to FIG. 3I, a bonding structure 260 is formed in the third trench 226' according to operation 106. The bonding structure 260 can include a Ni/Au structure electroplated on the metallic pad 214, but the disclosure is not limited thereto. Accordingly, the bonding structure 260 is physically and electrically connected to the metallic pad 214. In some embodiments, the third trench 226' is filled with the bonding structure 260, and thus a top surface of the bonding structure 260 is flush with a top surface of the sacrificial layer 240, though not shown. In alternative embodiments, the top surface of the bonding structure 260 can be lower than the opening of the third trench 226' and the top surface of the sacrificial layer 240. In some embodiments, a substrate 202 is received according to operation 112, wherein the substrate 202 includes the metallic pad 214, the sacrificial layer 240 over the metallic pad 214, the bonding structure 260 disposed in the sacrificial layer 240 and coupled to the metallic pad 214, and the barrier ring 250r between the bonding structure 260 and the sacrificial layer 240. Further, the barrier ring 250r surrounds at least a portion of the bonding structure 260, as shown in FIG. 3I.

Referring to FIG. 3J, a bonding layer 272 is disposed to bond the substrate 202 to another substrate 270 according to operation 107 or operation 114. For example, the substrate 202 is flipped and bonded to the substrate 270 on the first side 208a, as shown in FIG. 3J. In some embodiments, the substrate 270 can be a functional wafer, a capping wafer, or a carrier wafer, depending on the operation or the product requirements. In some embodiments, the substrate 202 and the substrate 270 are bonded by eutectic bonding, and the bonding layer 272 may be disposed between the substrate 202 and the substrate 270. In some embodiments, the substrate 202 and the substrate 270 are bonded by adhesive bonding, and the bonding layer such as an adhesive layer 272 may be disposed between the substrate 202 and the substrate 270, as shown in FIG. 3J. Adhesive bonding, using epoxies, silicones, photoresists, polymer, polyimides, benzocyclobutene (BCB), etc., is used to bond two substrates or bond a substrate to a carrier substrate. In some embodiments, the bonding layer 272 including BCB is disposed between the substrate 202 and the substrate 270. In some embodiments, the adhesive layer 272 is disposed by any suitable operations such as spin coating, etc.

Referring to FIG. 3K, a portion of the substrate 202 is removed according to operation 108. In some embodiments, the removal of the portion of the substrate 202 can be performed by a chemical mechanical polishing (CMP) operation, but the disclosure is not limited thereto. As shown in FIG. 3K, the removal is performed from the second side 208b of the substrate 202. In other words, the removal is performed on a side opposite to the bonding structure 260, or opposite to the substrate 270. In some embodiments, the base layer 204 and a portion of the active layer 206 of the substrate 202 are removed. Accordingly, the substrate 202 is thinned down, and thus a thinned substrate 202' is obtained. Further, the removal is performed such that the sacrificial layer 240 filling the second trench 222 is exposed. In other words, the removal is performed such that a bottom of a sacrificial pillar 242 is exposed, as shown in FIG. 3K.

Figure 4:
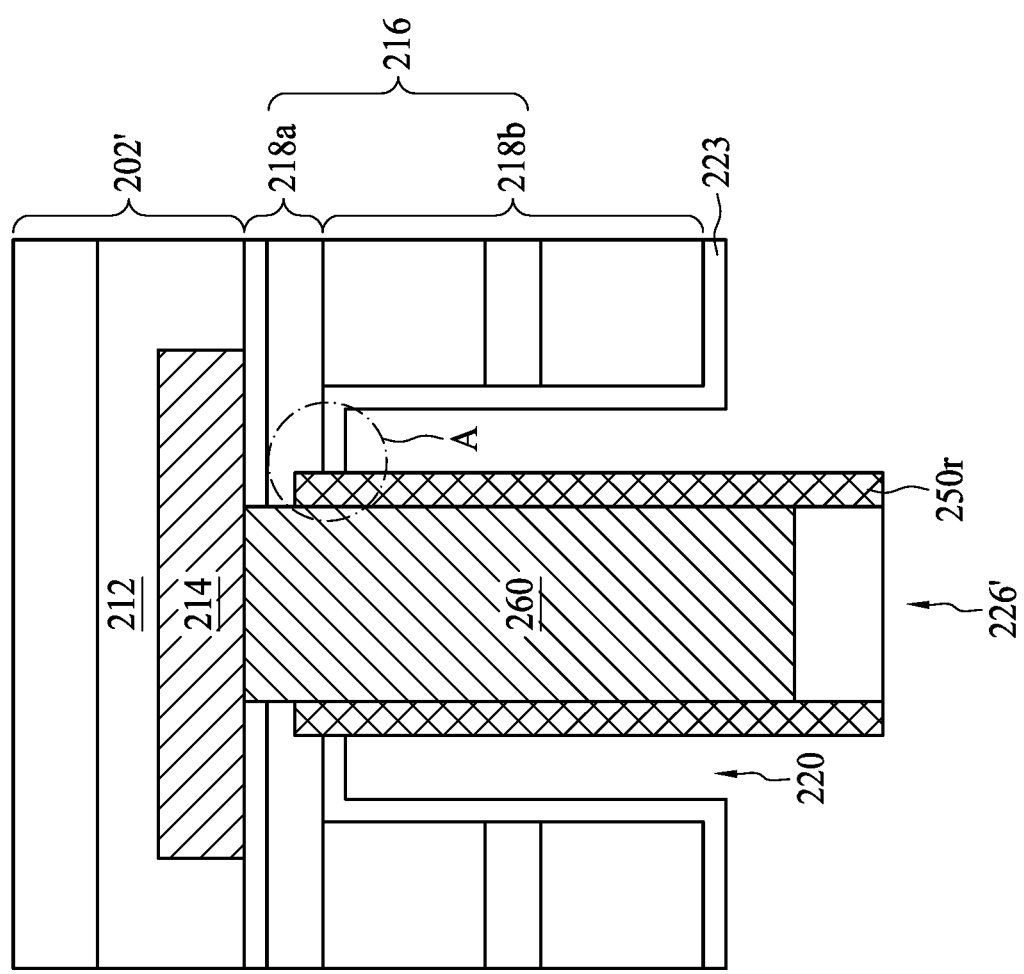
FIG. 4 is a schematic drawing illustrating an enlarged view of the bonding structure of the semiconductor structure shown in FIGS. 3A to 3L.

Referring to FIG. 3L and FIG. 4, wherein FIG. 4 is an enlarged view of the bonding structure 260, the sacrificial layer 240 is removed according to operation 109. In some embodiments, an etchant is introduced to remove the sacrificial layer 240 according to operation 116. In some embodiments, the etchant is vapor phase hydrofluoric acid (vHF). In some embodiments, vHF is introduced from the second side 208b of the substrate 202. Accordingly, the vHF etches away the sacrificial pillar 242, which is the sacrificial layer occupying the previously-existing second trench 222, and then the vHF etches away the sacrificial layer 240. Referring to FIG. 3L, after the removal of the entire sacrificial layer 240, an air gap 274 is formed between the substrate 202' and the substrate 270, and a through-hole 276 is formed in the substrate 202'. The barrier ring 250r is exposed to the air gap 274, and the through-hole 276 communicates with the air gap 274. Further, the through-hole 276 penetrates the substrate 202', as shown in FIG. 3L.

Notably, an etching rate of vHF on the barrier ring 250r is less than approximately 1 nm/min. In some embodiments, the etching rate of vHF on the barrier ring 250r is less than approximately 0.1 nm/min. In some embodiments, the barrier ring 250r includes the CVD-formed TiN, and an etching rate of vHF on the CVD-formed TiN is between approximately 0.04 nm/mm and approximately 0.08 nm/mm. In some embodiments, the barrier ring 250r includes the carbon-doped TiN, and an etching rate of vHF on the carbon-doped TiN is less than the CVD-formed TiN, because carbon is not affected by vHF. In some embodiments, the barrier ring 250r includes PI, and an etching rate of vHF on PI is approximately zero. In some embodiments, the barrier ring 250r includes $AlO_X$, and an etching rate of vHF on $AlO_X$ is approximately 0.03 nm/mm, because Al-based material is resistant to affects of vHF. Further, it is well-known that column structures formed in the TiN layer often become a vHF attack pathway. Therefore, the CVD-formed TiN, which includes fewer column structures than a PVD-formed TiN, provides better protection to the underlying materials.

The bonding structure 260 and the dielectric structure 216 are protected by the barrier ring 250r during the removal of the sacrificial layer 240 by vHF. It should be noted that if the thickness of the barrier layer 250 is less than 600 Å, the barrier layer 250 may too thin to withstand the effects of the etchant during the removal of the sacrificial layer 240. However, if the thickness of the barrier layer 250 is greater than 800 Å, residues of the barrier layer 250 may be found over the bottom of the third trench 226, which causes an adverse effect on the removal of the protection stack 218a of the dielectric structure 216. Further, residues of the protecting stack 218a and residues of the barrier layer 250 left over the bottom of the third trench 226' cause deterioration of the electrical connection between the bonding structure 260 and the metallic pad 214.

Because the barrier ring 250r and the insulating layer 223 seal and protect the dielectric structure 216, vulnerable junctions between the barrier ring 250r and the dielectric structure 216 or the insulating layer 223 are protected during the removal of the sacrificial layer 240, as indicated by circle A in FIG. 4. Consequently, the issue of undesired etching on the dielectric structure 216 is mitigated.

In some embodiments, the semiconductor structure 200 can be temporarily bonded with the substrate 270 (i.e. a carrier wafer) so as to facilitate a manipulation of the substrate 202'. After the substrate 202' is bonded with the substrate 270, the substrate 202' is processed via several operations as mentioned above. After completion of such operations, the substrate 202' can be separated from the substrate 270 and transported to integrate with other devices or circuitries. However, in other embodiments, the semiconductor structure 200 can be permanently bonded with the substrate 270 (i.e., a capping wafer or a functional wafer).

Referring to FIG. 3L, the semiconductor structure 200 is provided. The semiconductor structure 200 includes the substrate 202', and a metallic pad 214 is disposed over the substrate 202'. Notably, the metallic pad 214 is disposed on the first side 208a of the substrate 202'. The semiconductor structure 200 includes the dielectric structure 216 disposed over the substrate 202' on the first side 208a of the substrate 202. The dielectric structure 216 can be a multi-layer structure. In some embodiments, the dielectric structure 216 can include a protection stack 218a and a passivation stack 218b. In some embodiments, the insulating layer 223 can be a part of the dielectric structure 216. Since details about the protection stack 218a, the passivation stack 218b and the insulating layer 223 have been discussed as mentioned above, such details are omitted in the interest of brevity. As shown in FIG. 3L, the metallic pad 214 is exposed through the dielectric structure 216.

Still referring to FIG. 3L, the semiconductor structure 200 includes the bonding structure 260 disposed over and electrically connected to the metallic pad 214. The bonding structure 260 includes a bottom, and the bottom is in contact with the metallic pad 214. In some embodiments, the bonding structure 260 is separated from the dielectric structure 216 as shown in FIG. 3L, but the disclosure is not limited thereto.

The semiconductor structure 200 further includes a barrier ring 250r surrounding the bonding structure 260. In addition, the barrier ring 250r covers a portion of a sidewall of the bonding structure 260. In some embodiments, a portion of the sidewall of the bonding structure 260 that is in contact with the dielectric structure 216 is defined as a first portion, and another portion of the sidewall of the bonding structure 260 that is contact with the barrier ring 250r is defined as a second portion. Notably, a length of the second portion of the sidewall of the bonding structure 260 is greater than a length of first portion of the sidewall of the bonding structure 260, as shown in FIG. 3L. The barrier ring 250r is disposed to surround and contact the dielectric structure 216. In some embodiments, the barrier ring 250r, together with the insulating layer 223 of the dielectric structure 216, seal and protect the passivation stack 218b and the protection stack 218a around the bonding structure 260.

In some embodiments, the barrier ring 250r includes conductive materials, such as CVD-formed TiN or carbon-doped TiN, but the disclosure is not limited thereto. In some embodiments, the barrier ring 250r includes insulating material, such as aromatic PI or $AlO_X$, but the disclosure is not limited thereto. In other embodiments, the barrier ring 250r can include any suitable material able to withstand exposure to an etchant used to remove SiO materials. For example, materials having an etching rate of less than 1 nm/min when exposed to an etchant such as vHF can be used to form the barrier ring 250r. In some embodiments, a thickness of the barrier ring 250r is between approximately 600 Å and approximately 800 Å, but the disclosure is not limited thereto.

Still referring to FIG. 3L, the semiconductor structure 200 further includes the through-hole 276 penetrating the entire substrate 202' and the entire dielectric structure 216. Accordingly, a length of the through hole 276 is substantially the same as a sum of a thickness of the substrate 202' and a thickness of the dielectric structure 216, but the disclosure is not limited thereto. In some embodiments, the insulating layer 223 covers a sidewall of the through hole 276 and a surface of the dielectric structure 216, and thus the protection stack 218a and the passivation stack 218b of the dielectric structure 216 are protected from the etchant during forming of the through hole 276.

In some embodiments, the semiconductor structure 200 further includes the substrate 270, and the substrate 270 is bonded to the substrate 202'. Thus, the air gap 274 between the substrate 202' and the substrate 270 is formed. In some embodiments, the substrate 202' and the substrate 270 are bonded by eutectic bonding or adhesive bonding 272, but the disclosure is not limited thereto. In some embodiments, the barrier ring 250r is exposed to the air gap 274, as shown in FIG. 3L. In some embodiments, the bonding structure 260 is separated from the dielectric structure 216 by the barrier ring 250r. In some embodiments, the bonding structure 260 is separated from the dielectric structure 216 not only by the barrier ring 250r, but also by the air gap 274, as shown in FIG. 3L. In some embodiments, the through-hole 276 is in communication with the air gap 274. Additionally, the substrate 202' can be temporarily or permanently bonded to the substrate 270, depending on the product requirements.

Accordingly, the present disclosure therefore provides a semiconductor structure including the barrier ring disposed over a sidewall of the bonding structure. Accordingly, the barrier ring helps to seal and protect dielectric materials around the conductive structure. Thus, the effects of undesired etching to the dielectric materials are mitigated, and thus reliability of the semiconductor structure is improved.

In some embodiments, a semiconductor structure is provided. The semiconductor structure includes a first substrate, a metallic pad disposed over the first substrate, a dielectric structure disposed over the first substrate and a portion of the metallic pad, a bonding structure disposed over and electrically connected to the metallic pad, a barrier ring surrounding the bonding structure, and a through-hole penetrating the first substrate and the dielectric structure. The bonding structure includes a bottom and a sidewall, the bottom of the bonding structure is in contact with the metallic pad, a first portion of the sidewall of the bonding structure is in contact with the dielectric structure, and a second portion of the sidewall of the bonding structure is in contact with the barrier ring.

In some embodiments, a method for forming a semiconductor structure is provided. The method includes the following operations. A first substrate is received. The first substrate includes a first side and a second side opposite to the first side. A metallic pad is disposed over the first side. A dielectric structure is formed over the first substrate on the first side. The dielectric structure includes a first trench directly above the metallic pad. A second trench is formed in the dielectric structure and a portion of the first substrate. A sacrificial layer is formed to fill the first trench and the second trench. The sacrificial layer is formed over the first substrate. A third trench is formed directly above the metallic pad in the sacrificial layer. A barrier ring and a bonding structure are formed in the third trench. The barrier ring surrounds a portion of the bonding structure. A bonding layer is disposed to bond the first substrate to a second substrate. A portion of the second side of the first substrate is removed to expose the sacrificial layer within the second trench through the second side of the first substrate. The sacrificial layer is then removed by an etchant.

In some embodiments, a method for forming a semiconductor structure is provided. The method includes the following operations. A first substrate is received. A metallic pad is disposed over the first substrate, a sacrificial layer is disposed over the metallic pad, a bonding structure is disposed in the sacrificial layer and coupled to the metallic pad, and a barrier ring is disposed between the bonding structure and the sacrificial layer. Disposing a bonding layer to bond the first substrate to a second substrate. An etchant is introduced to remove the sacrificial layer to expose the barrier ring.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a first substrate;
   a metallic pad disposed over the first substrate;
   a dielectric structure disposed over the first substrate and a portion of the metallic pad;
   a bonding structure disposed over and electrically connected to the metallic pad;
   a barrier ring surrounding the bonding structure; and
   a through-hole penetrating the first substrate and the dielectric structure,
   wherein the bonding structure includes a bottom and a sidewall, the bottom of the bonding structure is in contact with the metallic pad, a first portion of the sidewall of the bonding structure is in contact with the dielectric structure, and a second portion of the sidewall of the bonding structure is in contact with the barrier ring.

2. The semiconductor structure of claim 1, wherein the barrier ring has a thickness, and the thickness is between approximately 600 angstroms (Å) and approximately 800 Å.

3. The semiconductor structure of claim 1, wherein a length of the second portion of the sidewall of the bonding structure is greater than a length of the first portion of the sidewall of the bonding structure.

4. The semiconductor structure of claim 1, wherein the barrier ring comprises conductive materials.

5. The semiconductor structure of claim 4, wherein the barrier ring comprises titanium nitride (TiN) or carbon-doped TiN.

6. The semiconductor structure of claim 1, wherein the barrier ring comprises insulating materials.

7. The semiconductor structure of claim 6, wherein the barrier ring comprises aromatic polyimide (PI) or aluminum oxide ($AlO_x$).

8. The semiconductor structure of claim 1, further comprising:
   a second substrate;
   a bonding layer, wherein the first substrate and the second substrate are bonded by the bonding layer; and
   an air gap between the first substrate and the second substrate.

9. The semiconductor structure of claim 8, wherein the bonding layer bonds the first substrate and the second substrate by an eutectic bonding or an adhesive bonding.

10. The semiconductor structure of claim 8, wherein the barrier ring and the dielectric structure are exposed to the air gap, and the through-hole is in communication with the air gap.

11. A semiconductor structure, comprising:
    a first substrate;
    a metallic pad disposed over the first substrate;
    a dielectric structure disposed over the first substrate and a portion of the metallic pad;
    a bonding structure disposed over and electrically connected to the metallic pad;
    a barrier ring surrounding the bonding structure;
    a second substrate;
    a bonding layer, wherein the first substrate and the second substrate are bonded by the bonding layer;
    an air gap between the first substrate and the second substrate; and
    a through-hole penetrating the first substrate and the dielectric structure, and in communication with the air gap,
    wherein the bonding structure is in contact with the metallic pad, the dielectric structure, the barrier ring and the bonding layer.

12. The semiconductor structure of claim 11, wherein a portion of the barrier ring is exposed to the air gap.

13. The semiconductor structure of claim 11, wherein a sidewall of the bonding structure comprises a first portion in contact with the dielectric structure and a second portion in contact with the barrier ring, and a length of the second portion is greater than a length of the first portion.

14. The semiconductor structure of claim 11, wherein the barrier ring comprises conductive materials.

15. The semiconductor structure of claim 11, wherein the barrier ring comprises insulating materials.

16. The semiconductor structure of claim 11, further comprising an insulating layer, wherein the dielectric structure is separated from the through-hole and the air gap by the insulating layer.

17. A semiconductor structure, comprising:
- a first substrate having a first side and a second side opposite to the first side;
- a metallic pad in the first substrate;
- a second substrate facing the first side of the first substrate;
- a bonding structure over the first side of the first substrate;
- a barrier ring surrounding the bonding structure; and
- a bonding layer bonded to the bounding structure, wherein the first substrate and the second substrate are bonded by the bonding layer and the bonding structure,
- wherein the barrier ring is in contact with the bonding structure and the bonding layer, the bonding structure is in contact with the metallic pad, and the barrier ring is separated from the metallic pad.

18. The semiconductor structure of claim 17, further comprising:
- a dielectric structure over the metallic pad and the first substrate on the first side of the first substrate,
- wherein the barrier ring is in contact with the dielectric structure.

19. The semiconductor structure of claim 17, wherein the barrier ring comprises a first portion and a second portion coupled to each other, the first portion is in contact the dielectric structure, and the second portion is exposed through the dielectric structure.

20. The semiconductor structure of claim 19, wherein a length of the second portion is greater than a length of the first portion.

* * * * *